United States Patent [19]

Cronin et al.

[11] Patent Number: 5,760,475
[45] Date of Patent: Jun. 2, 1998

[54] REFRACTORY METAL-TITANIUM NITRIDE CONDUCTIVE STRUCTURES

[75] Inventors: John Edward Cronin, Milton; Carter Welling Kaanta, Colchester; Michael Albert Leach, Bristol; Pei-ing Paul Lee, Williston, all of Vt.

[73] Assignee: International Business Machines Corporation, Armonk, N.Y.

[21] Appl. No.: 339,317

[22] Filed: Nov. 14, 1994

Related U.S. Application Data

[63] Continuation of Ser. No. 965,031, Oct. 21, 1992, abandoned, which is a continuation of Ser. No. 722,396, Jun. 19, 1991, abandoned, which is a continuation of Ser. No. 31,808, Mar. 30, 1987, abandoned.

[51] Int. Cl.$^6$ ............................................. H01L 23/48
[52] U.S. Cl. ........................ 257/758; 257/763; 257/915
[58] Field of Search ................................. 257/758, 751, 257/752, 753, 764, 763, 915

[56] References Cited

U.S. PATENT DOCUMENTS

| | | | |
|---|---|---|---|
| 3,879,746 | 4/1975 | Fournier | 257/767 |
| 4,513,905 | 4/1985 | Nowicki et al. | 228/123 |
| 4,520,041 | 5/1985 | Aoyama et al. | 427/88 |
| 4,560,421 | 12/1985 | Maeda et al. | 257/296 |
| 4,562,640 | 1/1986 | Widmann et al. | 29/591 |
| 4,566,026 | 1/1986 | Lee | 357/71 |
| 4,570,328 | 2/1986 | Price et al. | 29/571 |
| 4,582,563 | 4/1986 | Hazuki et al. | 257/774 |
| 4,624,864 | 11/1986 | Hartmann | 427/89 |
| 4,640,004 | 2/1987 | Thomas | 437/192 |
| 4,720,908 | 1/1988 | Wills | 257/774 |
| 4,772,571 | 9/1988 | Scouell et al. | 437/192 |
| 4,789,648 | 12/1988 | Chow et al. | 437/225 |
| 4,804,636 | 2/1989 | Groover, III et al. | 437/192 |
| 4,824,802 | 4/1989 | Brown et al. | 437/192 |
| 4,884,123 | 11/1989 | Dixit et al. | 257/774 |
| 4,931,411 | 6/1990 | Tigelaar et al. | 437/192 |
| 4,944,836 | 7/1990 | Beyer et al. | 156/645 |
| 4,960,732 | 10/1990 | Dixit et al. | 437/195 |
| 5,008,730 | 4/1991 | Huang et al. | 257/753 |
| 5,010,032 | 4/1991 | Tang et al. | 437/192 |
| 5,278,099 | 1/1994 | Maeda | 437/192 |

FOREIGN PATENT DOCUMENTS

| | | | |
|---|---|---|---|
| 127281 | 5/1984 | European Pat. Off. | 21/285 |
| 0267730 A2 | 4/1988 | European Pat. Off. | H01L 21/285 |
| 0605560 | 1/1985 | Japan | 357/71 |
| 60-5560 | 1/1985 | Japan . | |
| 61-102059 | 5/1986 | Japan | 257/915 |
| 61-212041 | 9/1986 | Japan . | |
| 2104290 | 2/1983 | United Kingdom | 21/285 |

OTHER PUBLICATIONS

IBM Tech. Disclosure Bulletin vol. 19 No. 7 Dec. 1976 Title: Barrier Layer Metallurgy For Preventing Reaction Between Aluminum And Polysilicon, By: W. Chu, et al.
IBM Tech. Disclosure Bulletin vol. 28 No. 9 Feb. 1986 Title: "Underlayer For Polycide Process".
IBM Tech. Disclosure Bulletin vol. 29 No. 3 Aug. 1986 Title: "Anisotropic And Selective Etching Of Tungsten Silicide-Tungsten-Tungsten Silicide Composite Stack".

(List continued on next page.)

Primary Examiner—Mark V. Prenty
Attorney, Agent, or Firm—Howard J. Walter, Jr.

[57] ABSTRACT

The present invention provides a conductive structure for use in semiconductor devices. The structure can be used to interconnect the various diffusion regions or electrodes of devices formed on a processed semiconductor substrate to a layer of metal, to interconnect overlying layers of metal or to provide the gate electrode of an FET device formed on the surface of a semiconductor substrate. Various embodiments of the invention are described, but in broad form the active metallurgy of the present invention comprises a thin continuous layer to titanium—titanium nitride and a thick layer of a refractory metal, e.g. tungsten, overlying the titanium nitride layer.

3 Claims, 1 Drawing Sheet

OTHER PUBLICATIONS

J. Electrochem. Society: Electrochemical Science Jun. 1967 vol. 114, No. 6, pp. 561–568 Title: "Vapor Deposition of Tungsten by Hydrogen Reduction of Tungsten Hexafluoride" By: J. Berkeley, et al.

Solid State Technology/Dec. 1982 pp. 85–90 Title: CVD Tungsten Interconnect and Contact Barrier Technology for VLSI, By: N. Miller.

International Electron Devices Meeting Dec. 1–4, 1985, pp. 610–613 Title: Highly Reliable One–Micron–Rule Interconnection Utilizing TiN Barrier Metal, By: T. Maeda, et al.

Chemical Vapor Deposition, Second International Conference, Los Angeles, CA.: May 10–15, 1970 pp. 409–421 Title: "The Adherence of Chemically Vapor Deposited Tungsten Coatings", By: W. Bryant.

Sachdev, et al. Title: "Tungsten Interconnects In VLSI", proceedings of 1985 Workshop Oct. 7–9, 1985 Albuquerque, New Mexico—Blewer ed. (Materials Research Society, Pittsburgh, PA—1986) pp. 161–171.

Woodruff, et al. Title: "Adhesion of Non–Selective CVD Tungsten to Silicon Dioxide" ,proceedings of 1985 Workshop Oct. 7–9, 1985, Albuquerque, New Mexico, Blewer ed. (Materials Research Society, Pittsburgh, PA—1986) pp. 173–186.

Varian Semiconductor Equipment Group Newsletter vol. 2, No. 2 Sep. 1986.

Thin Solid Films, 96 (1982) pp. 327–345 Electronics And Optics Title: The Use of Titanium–Based Contact Barrier Layers In Silicon Technology, By: C. Y. Ting, et al., Jun. 1982.

J. Vac. Sci. Technol.21(1), May/Jun. 1982 pp. 14–18 Title: TIN Formed by Evaporation as a Diffusion Barrier Between Al and Si, By: C. Y. Ting.

J. Vac. Sci. Technol. A3(4), Jul./Aug. 1985 pp. 1797–1803 Title: Properties and Microelectronic Applications of Thin Films of Refractory Metal Nitrides, By: M. Wittmer.

Jun. 25–26, 1985 V–MIC Conf. pp. 350–356 Title: CVD Tungsten Contact Plugs By In SITU Deposition and Etchback, By: Gregory C. Smith.

IBM Technical Disclosure Bulletin vol. 24 # 12 May 1982 by Ting.

T. Maeda et al., "Ti Thickness Optimization of TiN/Ti Barrier Metal Structure Based upon $BF_2$ Induced Damage Analysis," *IEEE 1986*, Jun. 9–10, 1986 V–MIC Conf. pp. 411–417.

V. V. S. Rana et al., "Thin Layers of the TiN and A1 As Glue Layers for Blanket Tungsten Deposition," *1987 Materials Research Society*, pp. 187–195.

REFRACTORY METAL-TITANIUM NITRIDE CONDUCTIVE STRUCTURES

This application is a continuation of application Ser. No. 07/965,031 filed Oct. 21, 1992, now abandoned, which was a continuation of application Ser. No. 07/722,396 filed Jun. 19, 1991, now abandoned, which was a continuation of application Ser. No. 07/031,808 filed Mar. 30, 1987, now abandoned.

BACKGROUND OF THE INVENTION

1. Field of the Invention

The present invention relates to a dual layer semiconductor conductive structure comprising titanium nitride in combination with a refractory metal. Also disclosed are stable metal electrodes, interconnection stacks and metal lines based on this conductive structures and processes for forming the same.

2. Cross-Reference to Related Applications

Reference is made to copending U.S. application Ser. No. 07/031,813 filed Mar. 30, 1987 and now U.S. Pat. No. 4,786,360, entitled "ANISOTROPIC ETCH PROCESS FOR TUNGSTEN METALLURGY" by W. Cote et al, assigned to the assignee of the present invention. The application relates to a chlorine-based plasma for anisotropically etching a tungsten-titanium nitride stack.

DESCRIPTION OF THE PRIOR ART

Until recently, aluminum and aluminum-based alloys have been the metallurgy of choice for the vast majority of semiconductor device applications. However, as the device densities of integrated circuits increase, there is a need to utilize metallurgies that can be conformally coated over the resulting steep topologies.

It has been found that the family of metals commonly referred to as the "refractory metals", some (i.e., tungsten, titanium, molybdenum, nickel, etc.) can be conformally coated on substrates using low pressure chemical vapor deposition techniques (LPCVD). In these techniques, a refractory metal source gas (e.g., tungsten hexafluoride) undergoes a series of reduction reactions so as to deposit a layer of tungsten on the substrate.

One of the problems with utilizing a refractory metal such as tungsten is that it has a poor degree of adhesion to silicon oxide. It has been suggested that this problem can be addressed by incorporating a barrier material. See, e.g., Sachdev and Mehta, "Tungsten Interconnects In VLSI", *Tungsten and Other Refractory Metals for VLSI Applications*, Proceedings of the 1985 Workshop held Oct. 7–9, 1985, Albuquerque, New Mexico; Blewer, Ed. (Materials Research Society, Pittsburgh, Pa. (1986)), pp. 161–171, which suggests that metals such as Hf, Zr, Ti, Nb, V, Cr and Ni could be used to promote the adhesion of LPCVD tungsten to silicon oxide; and an article contained in the Varian Corporation publication *The Varian Semi-Conductor Equipment Group Newsletter*, Vol. 2, No. 2, (September 1986), which suggests the use of Ti or Ni to improve the adhesion of tungsten to oxide and proposes to substitute tungsten silicide for these adhesion layers such that both the adhesion layer ($WSI_2$) and the metal layer (W) can be deposited in situ.

However, at least several papers have reported that titanium did not provide a sufficient degree of adhesion between tungsten and silicon oxide. See an article by Woodruff et al entitled "Adhesion of Non-Selective CVD Tungsten to Silicon Dioxide", *Tungsten and Other Refractory Metals for VLSI Applications*, pp. 173–176, Proceeding of 1985 Workshop Oct. 7–9, 1985, Albuquerqe, New Mexico (Materials Research Society, Pittsburgh, Pa. 1986), which indicates at Table 2 that conventional adhesion promoting layers such as polysilicon, chromium and titanium did not provide good adhesion between tungsten and silicon dioxide; see also an article by Bryant, "The Adherence of Chemically Vapor Deposited Tungsten Coatings" *Chemical Vapor Deposition*, Second International Conference, Los Angeles, Calif.; May 10–15, 1970, pp. 409–421, which discusses the use of a variety of layers as adhesion promoters for tungsten. In particular, titanium was found to have a low degree of adhesion to tungsten.

Other references of interest are as follows:

IBM Technical Disclosure Bulletin, Vol. 19, No. 7, December 1976, Chu et al, page 2532, teaches the use of titanium as a barrier material between aluminum and a polysilicon substrate to prevent spiking by silicon or aluminum migration.

IBM Technical Disclosure Bulletin, Vol. 28, No. 9, February 1986, Ahn et al, pages 3968 and 3969, teaches the use of titanium between a refractory metal silicide such as tungsten silicide and polysilicon to improve the adhesion of the refractory metal silicide to polysilicon while providing easy nucleation of the refractory metal silicide.

IBM Technical Disclosure Bulletin, Vol. 24, No. 12, May 1982, Ting, page 6272, teaches the use of a TiN film as a diffusion barrier and a conductor, the TiN film being prepared by doping Ti films with $N_2$ during Ti evaporation without substrate heating, the resulting film being annealed in a controlled ambient such as $N_2$, $NH_3$, $NH_3$ plasma, etc., at elevated temperatures around 800° C. or higher for 30 minutes.

U.S. Pat. No. 4,566,026 Lee et al teaches the use of a bi-metal layer located between two portions of an integrated circuit, the bi-metal layer comprising a sputtered layer of TiWN and a layer of TiN.

The article "CVD Tungsten Interconnect and Contact Barrier Technology for VLSI", *Solid-State Technology*, December 1982, pages 85–90, Miller et al teaches the use of CVD tungsten as a contact material that reduces contact resistance and protects shallow junctions from aluminum spike-induced failures as compared to CVD titanium-tungsten. Deposition process details are given.

The article "Highly Reliable One-Micron-Rule Interconnection Utilizing TiN Barrier Metal", *IEDM Technical Digest*, pp. 610–613 1985, Maeda et al, discloses the use of TiN as a barrier and contact metal in an AlSi interconnection system.

U.S. Pat. No. 4,513,905 Nowicki et al discloses a process for manufacturing integrated circuits in which a barrier layer of Cr or Ti is deposited in a partial atmosphere of $N_2$ in an Ar sputtering gas on a layer of Si so that the $N_2$ is incorporated in the Cr or Ti after which a conductor material is deposited on the barrier layer. The barrier layer reduces migration of Si and Cr through and over the conductor material.

U.S. Pat. No. 3,879,746 Furnier discloses that incorporating a titanium nitride layer between thin films of titanium and platinum metallizations will reduce the interdiffusion rates and inhibit intermetallic compound formation between the titanium and platinum metallizations.

U.S. Pat. No. 4,570,328 Price et al discloses an MOS device having an electrode and interconnect of titanium nitride which is formed by low pressure chemical vapor deposition.

IBM Technical Disclosure Bulletin, Vol. 29, No. 3, August 1986, Cronin et al, Page 1151, discusses etch chemistry and improves etch selectivity and eliminates preferential attack of a tungsten silicide-tungsten-tungsten silicide stack during reactive ion etching.

SUMMARY OF THE INVENTION

The present invention provides a conductive structure for use in semiconductor devices. The conductive structure can be used as follows: (1) to interconnect the various regions of conventional devices formed on a processed semiconductor substrate to form memory arrays and/or logic and support circuits, (2) to interconnect various metal layers, or (3) to form a gate electrode on the surface of a semiconductor substrate.

Various embodiments of the invention are described, but in broad form the conductive structure of the present invention comprises a layer of titanium nitride beneath a layer of a refractory metal such as tungsten or molybdenum. It has been found that this combination of materials provides a combination of characteristics (e.g., high adhesion, low contact resistance, similar etch rate, etc.) that lend themselves to use in the above-described semiconductor device applications.

DESCRIPTION OF THE PREFERRED EMBODIMENTS

I. Parameters To Be Optimized

Figure 1:
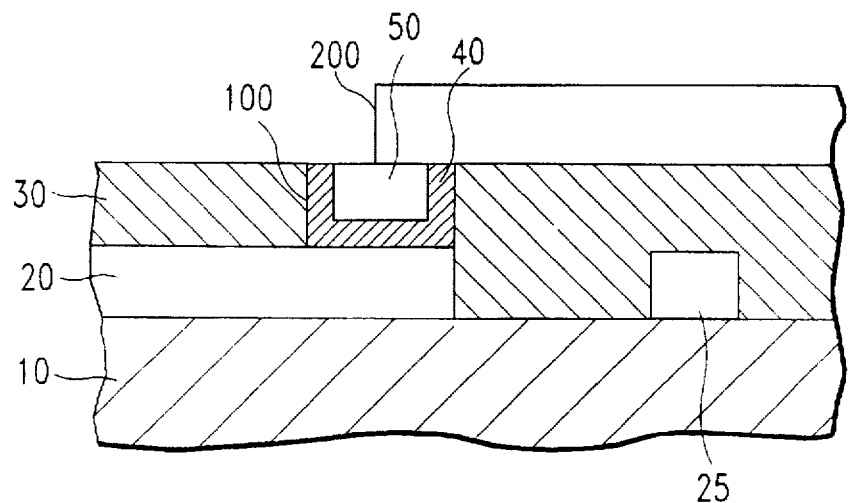
FIG. 1 illustrates in schematic form a cross-sectional view of the conductive stack of the present invention as used to form an interconnection between two layers of metal.

In the description of the invention to follow, reference will be made to parameters that are optimized by the conductive structure of the invention. These parameters, along with their relation to the invention, are described below. (1) In semiconductor processing, the adhesion of an upper layer to the layer or layers immediately below it must be high enough so that the respective layers do not delaminate. At the same time, the upper layer should not impart appreciable film stresses upon the lower layers. It has been found that when a refractory metal such as tungsten is deposited upon underlying layers such as passivating glasses, (e.g., borophosphosilicate glass (BPSG) or phosphosilicate glass (PSG)), the refractory metal will partially delaminate from the glass when exposed to subsequent processing steps. One method of increasing the adhesion between tungsten and the underlying layers is to incorporate an intermediate material having a high degree of adhesion to both tungsten and the underlying materials. The inventors have found that an intermediate layer of titanium nitride will provide a high degree of adhesion between tungsten and underlying layers such as passivating glasses. (2) In most applications, conductive structures such as gate electrodes and interconnecting stacks should have sidewalls that are as nearly vertical as possible. To the extent that these sidewalls are not vertical, extra chip surface area is unnecessarily consumed and the electrical properties of the conductive structure are degraded. Accordingly, an intermediate layer incorporated between tungsten and the underlying layers should have an etch rate that approximates the etch rate of tungsten films in an anisotropic (i.e., directional) etch such as a halogen-based reactive ion etch (RIE). It has been discovered that among the variety of materials tested (e.g., molybdenum, chromium and Ti/W alloys), titanium nitride had a substantially equal etch rate to tungsten in a halogen-based RIE. Therefore, an isotropic profile can be achieved between the two layers. (3) To form a conformal coating of tungsten or molybdenum, CVD techniques are preferred over sputtering or evaporation techniques. In CVD of tungsten, tungsten reduction is induced from a tungsten hexafluoride ($WF_6$) source gas. As a consequence, tungsten crystals form and grow on the underlying layers. The ability of these crystals to form and grow (i.e., nucleate) on the underlying layers is essential to provide a uniform film. The inventors have found that titanium nitride presents good nucleation sites for CVD tungsten or molybdenum. (4) Titanium nitride has also been found to provide good barrier properties when incorporated in a tungsten-titanium nitride stack. In the case where tungsten is used as an interconnect structure or as a wiring plane, titanium nitride provides sufficient resistance against electromigration. Moreover, titanium nitride prevents diffusion of species (e.g., silicon) from the underlying layers into the tungsten at processing temperatures of up to 1000° C. Finally, as will be described in detail below, titanium nitride serves as a good barrier against fluorine penetration during CVD of tungsten. (5) Finally, the overall resistance of the conductive stack should be kept as low as possible. This is particularly true when considering the contact resistance of an interconnect stack. The inventors have found that a tungsten-titanium nitride conductive stack provides an extremely low contact resistance.

II. General Process Description

As discussed above, the inventors have found that titanium nitride presents the combined factors of high adhesion, similar etch rate, good nucleation, good diffusion prevention and low contact resistance when used in combination with a refractory metal layer. As such, the conductive stack of the invention can be used in a variety of applications, as will be discussed later.

A general description of the process for forming the conductive stack of the invention will now be given. The process begins with forming titanium nitride on a conventionally processed semiconductor substrate (i.e., a substrate having one or more diffusion regions or other structures previously formed therein or thereon, respectively). Two general techniques will be described for forming this layer. The first involves annealing a titanium layer in a nitride forming ambient, so as to nitridize at least the top surface of the titanium layer. The second involves directly depositing a titanium nitride layer.

A first method of forming a titanium nitride layer involves forming a layer of titanium as discussed above and then subjecting the same to annealing in nitrogen at a temperature of about 550° C. to about 650° C. Titanium can be formed by conventional evaporation, sputtering or CVD techniques. It is preferred that titanium be formed by sputtering from a Ti source in an argon atmosphere to a thickness of 300 Å to 600 Å ; similar thicknesses would apply to the use of evaporation or CVD. Generally speaking, an annealing temperature of at least about 550° C. will be used.

As a consequence of the above procedure, at least the top surface of the titanium layer is nitrided, generally to a thickness of about 150 Å to about 300 Å (i.e., one-half the total thickness of the Ti layer).

The pressure of the anneal is not overly important and is typically in the order of about 1 atmosphere.

Times are merely selected to achieve the desired thickness of the nitrided layer, and a typical anneal will be on the order of 20 minutes at temperature.

There are, however, certain problems which can be encountered when sputtered titanium is subjected to a nitrogen anneal. For example, subsequent backside flaking of tungsten can be encountered and, in addition, the step coverage of titanium may be often inadequate, especially if a thin titanium film is used.

As an alternative to nitrogen annealing a titanium layer, typically a sputtered titanium layer, a second method of forming titanium nitride involves low pressure CVD (LPCVD) or plasma enhanced CVD (PECVD) of a TiN alloy.

The reactions involved in LPCVD and PECVD can be characterized as follows (where (g) means gas and (s) means solid):

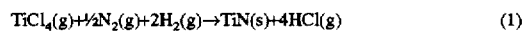  (1)

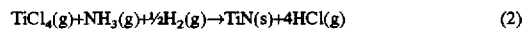  (2)

LPCVD and PECVD are conducted in a conventional manner and are generally conducted at a pressure of about 50 to about 500 mTorr, a temperature of about 350° to about 650° C. and at a deposition rate of about 150 to about 500 Å/minute to yield a TiN film about 300 to about 1,000 Å thick.

The resulting TiN film will cover small contacts as well as the backside of the semiconductor wafer being processed.

In addition, titanium nitride could also be formed by conventional reactive sputtering (i.e., introducing nitrogen into a titanium argon sputter ambient).

A final procedure which can be used to form a TIN layer is to use an NH$_3$ titanium anneal instead of an N$_2$ anneal. As earlier indicated, when an N$_2$ anneal cycle is used for sputtered titanium to form TIN, generally speaking the temperature involved will be at least 550° C. The inventors have found that an NH$_3$ anneal cycle can be carried out at lower temperatures (e.g., about 400° C. to about 450° C.). An NH$_3$ anneal cycle at low temperature permits the use of CVD oxide as an interlayer dielectric and eliminates the concern of oxide cracking and shorting at higher temperatures. In addition, the NH$_3$ anneal cycle at low temperature is more compatible with aluminum metallurgies that may reflow at higher processing temperatures. The NH$_3$ reaction involved is as follows:

  (3)

From a chemical standpoint, the chemisorption rate will be enhanced due to the polarity of NH$_3$ as compared to N$_2$. Further, more dissociative H will be produced with the use of NH$_3$ and, as a consequence, titanium oxidation should be reduced. Titanium oxidation can lead to high line resistance and contact resistance problems. The greater amount of hydrogen present should also reduce charge resistance and increase device performance. Finally, the bonding energies for N$_2$ and NH$_3$ (both gaseous) are 9.9 and 3.3 eV, respectively. The lower bonding energy of NH$_3$ permits it to form "N" radicals such as NH$_2$$^+$, NH$^+$, etc., more easily. It is believed that the combination of higher chemisorption rate and lower bonding energy permits reaction (3) to occur at temperatures of up to about 150° C. lower than those required to generate titanium nitrization by use of an N$_2$ anneal. This also holds true for forming TiN by LPCVD or PECVD (i.e., reaction (2) should provide the same low temperature results).

As is the case with an N$_2$ anneal cycle, typically the original titanium layer which is about 300 Å to about 600 Å thick will have the upper surface thereof converted to TiN to a thickness of about 150 Å to about 300 Å during the course of an NH$_3$ anneal cycle at about 400° C. to about 450° C. for 20 minutes at temperature.

After the TiN layer is formed using one of the above techniques, its upper surface is overcoated with CVD W. CVD W provides major advantages to VLSI technology. Primarily it prevents electromigration, provides excellent metal spiking resistance, and possesses better hole fill and step coverage capabilities than does W formed by conventional sputtering or evaporation techniques.

CVD W is conveniently formed by flowing SiH$_4$ (100–200 sccm) and WF$_6$ (200–400 sccm) in the presence of hydrogen and a carrier gas at 450° C. for a time sufficient to form a layer at least 0.7 μm thick.

Since CVD W is formed using WF$_6$ as a reactive source, i.e., a fluorine-rich deposition environment is involved, insulative non-volatile fluorine compounds may form which degrade the conductive and adhesive properties of underlying layers. For example, if tungsten silicide is the underlying layer, the fluorine content in the underlying layer tracks the silicon content in the silicide. If titanium is the underlying layer, the fluorine content is relatively high at the Ti/W interface and a significant amount of this fluorine penetrates into the layers beneath the titanium underlayer.

However, the inventors have found that when the underlayer is formed of titanium nitride, approximately two orders of magnitude less non-volatile fluorine compounds are absorbed. That is, an elemental analysis reveals that the peak fluorine content in a TiN underlayer is two orders of magnitude lower than the peak content in a Ti underlayer. Moreover, virtually no fluorine penetrates through the TiN layer to underlying layers.

At first the inventors thought that this phenomena was due to the TiN thermal cycle. Several experiments were run wherein deposited titanium was annealed in an inert ambient (argon) instead of nitrogen or ammonia, such that TiN was not formed. After tungsten deposition, the resulting fluorine content was approximately the same in annealed titanium as in unannealed titanium. Apparently it is the TiN lattice that prevents fluorine absorption and penetration to a much greater degree than does titanium.

This two orders of magnitude reduction in fluorine absorption may be the direct cause of the observed 2X improvement in W/TiN/SiO$_2$ adhesion as compared to W/Ti/SiO$_2$ adhesion. It has been repeatedly observed that a W/Ti/Si$_2$ stack delaminates upon application of a 90° peel test (the force applied being on the order of 500 lb/in$^2$). However, it has also been repeatedly observed that a W/TiN/SiO$_2$ stack does not delaminate at this applied force. Other tests have confirmed that the adhesion of the TiN-based stack is on the order of 1000 lb/in$^2$. This 2X adhesion improvement is sufficient to make W-based metallurgy applicable to the conductive structures discussed below.

After the CVD W has been formed on the Ti or TiN, in some applications a "capping layer" should be provided on the W layer. In general, after the W is formed in a deposition tool, the wafer is taken to another tool for subsequent processing. It has been found that the W layer is extremely susceptible to foreign material penetration or oxidation as soon as the CVD gas flow is terminated within the deposition tool. Accordingly, it is preferred that a 50–100 Å thick layer of WSi$_2$ be formed in situ by greatly decreasing the WF6 flow to under 11 sccm while maintaining the SiH$_4$ flow at approximately 200 sccm. It has been found that this thin WSi$_2$ film will resist oxidation and foreign material penetration to a much greater degree than will W alone. In practice, the WSi$_2$ layer is subsequently removed prior to the next processing step.

After removal of the WSi$_2$ capping layer in a wet etchant that does not appreciably attack the underlying tungsten (e.g., nitric acid/ammonium fluoride), a conventional photosensitive polymer (e.g., a novolac resin) is deposited, exposed and developed to define the conductive structure. Then the layers are etched in a halogen-based RIE. In general, it has been found that while an anisotropic profile can be generated using fluorine-based chemistries such as CF$_4$/O$_2$, the best results are achieved using a chlorine-based plasma such as Cl$_2$/O$_2$. As described in previously cited U.S. Pat. No. 4,786,360 (the teaching of which are incorporated herein by reference), this plasma chemistry provides a combination of high etch rate, high etch selectivity to the underlying glass and highly anisotropic sidewall etching.

A layer of nitride may be deposited on the tungsten prior to depositing the photosensitive polymer. During metal etch in a Cl$_2$/O$_2$ RIE, the photoresist may be totally removed. Since nitride has a high etch rate ratio to tungsten in Cl$_2$/O$_2$, the nitride forms a "non-erodible mask" that prevents erosion of the mask image. As an alternative, a thicker layer of resist may be used. As another alternative, a plurality of resist layers may be use.

A more specific description of the process for forming the conductive structures of the invention will be rendered with reference to the Example described below.

III. Applications

The conductive structure as generally described above can be used in a variety of applications. These applications are shown in the accompanying drawing.

FIG. 1 shows a first embodiment of the invention, comprising an interconnecting stack 100 made up of a titanium nitride layer 40 and an overlying refractory metal layer 50, e.g., tungsten or molybdenum. The interconnecting stack 100 couples a lower conductive line 20 to an upper conductive line 200.

The structure of FIG. 1 is formed by depositing and patterning the conductive line 20 on the processed substrate 10, depositing a glass passivating layer 30, anisotropically etching the passivation layer 30 to expose a portion of the underlying conductive line 20, forming layers of titanium nitride 30 and tungsten 40 as previously described, etching the films so that portions thereof above the surface of passivating layer 30 are removed, such that the tungsten substantially fills the opening in the passivating layer and is removed from the surface thereof, as shown in FIG. 1, and depositing and patterning the upper conductive line 200 so that at least a portion thereof contacts the underlying interconnecting stack 100. Conventional metallurgy 25 is also shown.

Figure 2:
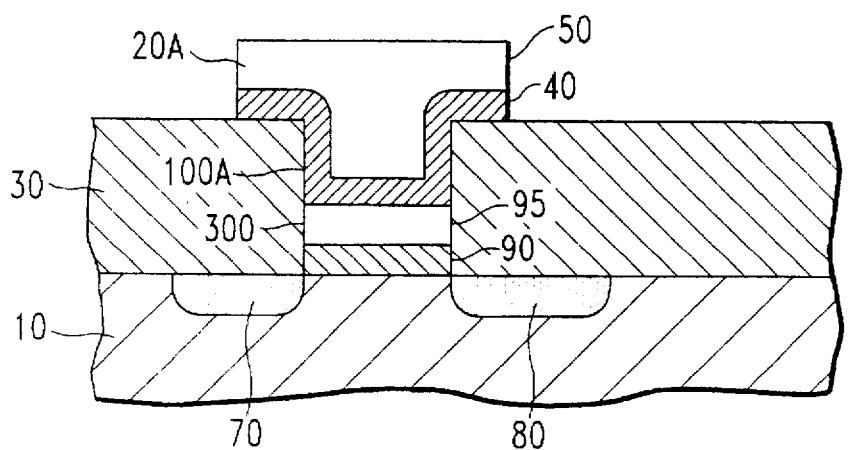
FIG. 2 illustrates in schematic form a cross-sectional view of the conductive stack of the present invention as used to form an interconnection between a layer of metal and a gate electrode of an FET device.

FIG. 2 shows a second embodiment of the present invention in which the interconnecting stack 100A couples an overlying conductive line 20A to a gate electrode 300 of an underlying FET device. The FET is defined by source and drain diffusion regions 70, 80 that define a channel region having a gate insulator 90 and a conductive material 95 formed thereon. The conductive material 95 can be formed of any conventional electrode material such as doped polysilicon or a refractory metal silicide. Note that both the stack 100A and the overlying conductive line 20A are formed of the same layers. This is done by modifying the procedure discussed in FIG. 1. Instead of removing all of the layers above the surface of the passivation layer, a photolithographic mask can be formed and the tungsten 50 and the underlying titanium nitride 40 can be anisotropically etched in a halogen-based RIE such as Cl$_2$/O$_2$. Other numerals have the same meaning as in FIG. 1.

As previously discussed, since the W and TiN layers have approximately the same etch rate in this etchant, the resulting conductive line will have substantially vertical sidewalls. The stack-conductive line combination has been found to provide low sheet resistance (which is needed for dense dynamic memory array applications).

An example of the contact resistance improvement presented by TiN versus Ti will now be rendered with reference to FIG. 2. Measurements have shown that the contact formed by the conductive stack 100A has a contact resistance of 0.3–1.0 Ω/contact. Assuming each contact is approximately 0.7 μm×0.7 μm, the contact resistance is equal to 0.6–2.0 Ω/μm$^2$. When Ti is used instead of TiN, the contact resistance is approximately 1000–1300 Ω/contact or 2K–2.6K Ω/μm$^2$. Thus, the TiN worst case—Ti best case difference is approximately 3 orders of magnitude.

While it is generally known that TiN can be more conductive than Ti, this enormous contact resistance differential was entirely unexpected. Based on the film studies previously described, it is believed that this contact resistance differential is due to the decrease in fluorine penetration in a TiN layer as opposed to a Ti layer.

Note also that the stack 100A could be coupled to any conductive structure on the processed substrate (e.g., one of the diffusions 70, 80) instead of to the gate electrode 300 as shown in FIG. 2.

Figure 3:
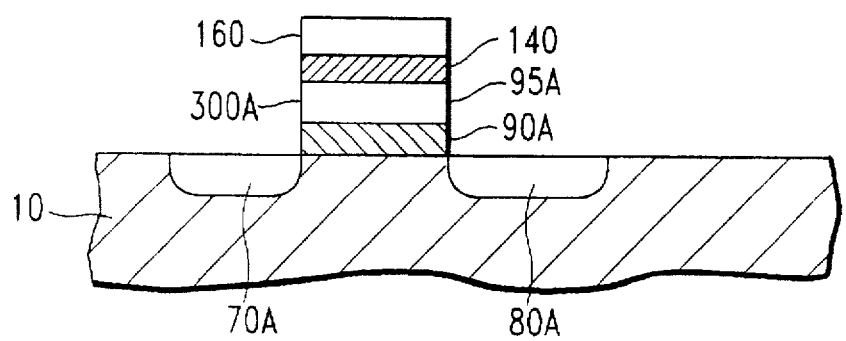
FIG. 3 illustrates in schematic form a cross-sectional view of the conductive stack of the present invention as used to form a gate electrode of an FET device.

While the discussion to date has been in the context of an interconnection conductive structure, the stack of the present invention can also be used to form a stable metal gate electrode which exhibits low resistance and high stability. This gate electrode is shown in FIG. 3.

It is well accepted in the art that low resistance gate electrodes are required for dense VLSI circuits. For example, the use of thick refractory metal on a polysilicon electrode is known to reduce word line resistance. However, such arrangements will not withstand the high temperatures used in typical subsequent hot process steps (e.g., greater than 700° C.). This is due to the interaction between the refractory metal and the polysilicon to form a silicide. While it is known in the art to decrease the gate electrode sheet resistance by the use of silicides, such silicides still increase resistance by two times as compared to that achieved by metals. Moreover, silicide formation will degrade the yield of thin gate dielectrics. In other words, as the thickness of gate dielectrics is decreased so that lower voltages may be used, the dielectrics are more susceptible to damage induced by silicide diffusing downward to the substrate during the course of a silicide reaction.

In general, silicide is a good diffusion channel for P or N-type dopants. Moreover, the formation of thick silicide will also "soak out" dopant impurities from the underlying polysilicon. This causes interdiffusion of the dopants, limiting the use of P$^+$ and N$^+$ gate electrodes in CMOS circuits.

Accordingly, it has been highly desired in the art to obtain low resistance gate electrodes which can be formed at low temperatures.

Basically, the third embodiment of the present invention is directed to forming a temperature resistant, low sheet resistance gate electrode. Due to the excellent contact resistance and barrier properties of TiN, it is preferred to initially form a TiN layer at low temperature using any of the procedures earlier described. The TiN layer is formed prior to the deposition of any other metal films. The TiN layer will prevent Si diffusion into the W layer which is to be next formed thereon. The TiN layer will thus prevent both the formation of any silicide and the out-diffusion of dopant impurities from the underlying polysilicon layer into the W layer.

A typical procedure is now described with reference to FIG. 3 which shows gate electrode 300A on a standard silicon substrate 10 having source and drain regions 70A and 80A. A thin (100 Å or less) dielectric layer 90A (e.g., a combination of silicon nitride and silicon oxide, and/or silicon oxynitride) is formed by any conventional procedure, e.g., CVD, wet oxidation and/or nitrization. Polysilicon layer 95A ($P^+$ or $N^+$) is then formed on the dielectric layer 90A by any conventional procedure. A thin layer of Ti 140 is formed by sputtering, to a thickness equal to or less than 30 nm, whereafter the structure is annealed, e.g., in $NH_3$ at about $400°$ C. to about 500° C. for 30 to 60 minutes. This converts at least the upper surface of the sputtered Ti layer into a TiN layer 140. Similarly to the previous embodiments, the TiN layer can be formed using other techniques. Thereafter, the desired refractory metallurgy 160, e.g., W or Mo, more preferably W, can then be deposited. The layers are masked and anisotropically etched in a halogen-based RIE. The resulting W/TiN/polysilicon structure was found to be stable (i.e., no silicide formation) even after annealing at 1000° C. for 60 minutes. Moreover, the breakdown voltage of the thin dielectric was not degraded.

Having thus generally described the three structural embodiments of the invention, the following Example is offered to illustrate the invention in more detail.

Example 1

This Example relates to a process for forming an interconnection stack as shown in FIG. 2.

Titanium was sputtered onto conventionally processed silicon wafers to form a layer 50±10 nm thick. The Ti targets were sputtered by bombardment with argon ions in a chamber held at 10 mTorr and 4 KW. Then the titanium was nitridized by annealing in nitrogen gas at 550° C. for approximately 20 minutes at temperature. The resulting TiN layer exhibited a sheet resistance on the order of 40±20 $\Omega/Cm^2$.

Tungsten was then deposited by LPCVD. At first the deposition gases comprised $SiH_4$ (140 sccm), $WF_6$ (300 sccm), $H_2$ (2500 sccm) and helium (100 sccm) to deposit 0.15 µm of tungsten; then the $SiH_4$ flow was eliminated and the $H_2$ flow was increased by 700 sccm to deposit 0.55 µm of tungsten. Then, $SiH_4$ at 180 sccm was reintroduced and the $WF_6$ flow was reduced to approximately 10 sccm so as to deposit 50 Å of WSi. After the wafers were removed from the tungsten deposition tool, they were exposed to a 20:1 nitric acid/ammonium fluoride solution which removed the $WSi_2$ cap without appreciably affecting the underlying tungsten layer.

After a 400 nm layer of nitride was deposited on the tungsten, a layer of A1100 adhesion promoter (manufactured and sold by E. I. DuPont de Neumors Co. of Wilmington, Del.) was spin-applied on top of the tungsten, and a novolac-based photoresist was spin-applied onto the A1100. The photoresist was comprised of a m-cresol novolak resin and a tricyclodecanediazoquinone sensitizer. Details regarding the composition, etc., of the photoresist are disclosed in U.S. Pat. No. 4,397,937, issued Aug. 9, 1983 and assigned to the assignee of the present invention, the teachings of which are herein incorporated by reference. After the photoresist was exposed and developed, it was hardened by introduction of a silicon-containing agent (i.e., 10% by weight hexamethylcyclotrisilazane in xylene). This step increases the resistance of the photoresist to erosion induced by an $O_2$-containing RIE. After the photoresist was hardened, exposed portions of the underlying nitride layer were removed by exposure to a combination of $CHF_3$ (75 sccm) and oxygen (10 sccm) gases with the etch chamber held at a power of 800 watts.

Using the combined photoresist-nitride layers as a mask, the exposed portions of the tungsten and the underlying titanium nitride were etched in a mixture of $Cl_2$ (20 sccm) and $O_2$ (18 sccm), with the etch chamber being held at 90 mTorr and 400 watts. Finally, the nitride mask was removed by exposure to a plasma gas comprised of $NF_3$ (44 sccm) and $CO_2$ (9 sccm).

While the invention has been described in detail and with reference to specific embodiments thereof, it will be apparent to one skilled in the art that various changes and modifications can be made therein without departing from the spirit and scope thereof.

What is claimed is:

1. A conductive structure formed on a processed semiconductor substrate, comprising:

a first layer of patterned metallurgy;

a layer of passivating glass on said first layer of patterned metallurgy, said layer of passivating glass having an upper surface and having an opening therein to expose a portion of said first layer of patterned metallurgy;

a continuous layer of Ti-TiN lining only said opening in electrical contact with said first layer of patterned metallurgy, said continuous layer of Ti-TiN having a lower surface consisting of Ti and an upper surface consisting of stoichiometric TiN, at least an upper half of said continuous layer of Ti-TiN consisting of TiN, a layer of tungsten on said continuous layer of Ti-TiN, said tungsten substantially filling the remainder of said opening such that no tungsten is present on said upper surface of said layer of passivating glass; and a second layer of patterned metallurgy in electrical contact with said layer of tungsten and, via said continuous layer of Ti-TiN, in electrical contact with said first layer of patterned metallurgy.

2. A conductive structure formed on a processed semiconductor substrate according to claim 1 wherein said passivating glass is borophosphosilicate glass.

3. A conductive structure formed on a processed semiconductor substrate according to claim 1 wherein said passivating glass is phosphosilicate glass.

* * * * *